United States Patent
Komai et al.

(10) Patent No.: US 6,479,384 B2
(45) Date of Patent: Nov. 12, 2002

(54) PROCESS FOR FABRICATING A SEMICONDUCTOR DEVICE

(75) Inventors: Naoki Komai, Kanagawa (JP); Yuji Segawa, Tokyo (JP); Takeshi Nogami, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/784,715

(22) Filed: Feb. 15, 2001

(65) Prior Publication Data
US 2001/0019892 A1 Sep. 6, 2001

(30) Foreign Application Priority Data
Feb. 18, 2000 (JP) ........................................ 2000-040738

(51) Int. Cl.[7] .............................................. H01L 21/44
(52) U.S. Cl. ........................ 438/687; 438/678; 438/686
(58) Field of Search ................................. 438/687, 678, 438/686, 685, 675, 658, 656, 653–654, 650, 648, 643–644, 627, 629

(56) References Cited

U.S. PATENT DOCUMENTS

| 5,272,111 A | * | 12/1993 | Kosaki ........................ 438/614 |
| 5,525,204 A | * | 6/1996 | Shurboff et al. ............ 205/125 |
| 5,674,787 A | * | 10/1997 | Zhao et al. .................. 438/627 |
| 5,824,599 A | * | 10/1998 | Schacham-Diamand et al. . 438/678 |
| 5,830,563 A | * | 11/1998 | Shimoto et al. ............. 428/209 |
| 6,060,176 A | * | 5/2000 | Semkow et al. ............. 428/620 |
| 6,197,688 B1 | * | 3/2001 | Simpson ...................... 438/678 |
| 6,251,781 B1 | * | 6/2001 | Zhou et al. .................. 438/687 |

* cited by examiner

Primary Examiner—Tuan H. Nguyen
Assistant Examiner—Thanh Nguyen
(74) Attorney, Agent, or Firm—Sonnenschein, Nath & Rosenthal

(57) ABSTRACT

A process for fabricating a semiconductor device, which comprises forming, on a metal wiring formed from copper or a copper alloy, a barrier film which functions as a diffusion-preventing film for the metal wiring by an electroless plating method, wherein a catalytic metal film which serves as a catalyst in the electroless plating method is selectively formed on the metal wiring by a displacement plating method using a displacement plating solution at a temperature in the range of 30° C. or more and lower than a boiling point thereof, and the barrier film is selectively formed on the catalytic metal film by the electroless plating method. It is an object of the present invention, to selectively and uniformly carry out the catalyst activation to the surface of the metal wiring made of copper or a copper alloy by using palladium so as to improve plating property of the electroless plating method using a hypophosphite as a reducing agent and the reliability of the wiring.

18 Claims, 3 Drawing Sheets

PROCESS FOR FABRICATING A SEMICONDUCTOR DEVICE

BACKGROUND OF THE INVENTION

1. Field of the Invention

The present invention relates to a process for fabricating a semiconductor device. More particularly, the present invention is concerned with a process for fabricating a semiconductor device using a trench wiring technique, such as a dual Damascene process or a single Damascene process.

2. Related Art

As a material for wirings in large scale integrated-circuits (LSIs), an aluminum alloy has conventionally been used. As strong demands for LSI's which are further reduced in size and exhibit high speed increase, the wiring made of an aluminum alloy is difficult to meet such demands and secure a satisfactory performance (high reliability and low resistance). As a method for solving this problem, attention is drawn to a technique for forming a wiring from copper which has an excellent resistance to electromigration and a low resistance, as compared to the aluminum alloy, and studies are being made with a view toward putting this technique into practical use.

Generally, copper is not easily dry-etched. Therefore, in the formation of a copper wiring, a process of forming a trench wiring is promising. The trench wiring is produced by a process in which a predetermined trench is preliminarily formed in an interlayer dielectric comprised of, for example, silicon oxide, and the trench is plugged with a wiring material. Then, the excess wiring material is removed by, for example, a chemical mechanical polishing (hereinafter, frequently referred to simply as "CMP") process, to thereby form a wiring in the trench.

The copper wiring is generally used in the form of a multilayer wiring. When such a multilayer copper wiring is formed, no barrier film which prevents copper from diffusing is present on the surface of the copper wiring. Therefore, before an upper layer wiring is formed on the copper wiring, as a diffusion-preventing film for copper, a barrier film comprised of silicon nitride, carbon nitride or the like is formed on the copper wiring. Silicon nitride and carbon nitride have a relative dielectric constant larger than that of silicon oxide. Therefore, it is considered that these are advantageous in a method in which the surface of copper after the CMP process is selectively coated with these. In addition, U.S. Pat. No. 5,695,810 discloses a method in which the surface of copper is coated with a cobalt tungsten phosphorus (CoWP) film. In this method, cobalt tungsten phosphorus is deposited by an electroless plating method using the surface of copper as a catalyst.

Further, Japanese Patent Application Laid-Open Specification No. 9-307234 (which is one of basic applications of U.S. Pat. No. 5,830,563) discloses a method used in a printed-wiring substrate, in which the exposed copper surface is subjected to palladium displacement plating, and electroless plating is conducted using the displaced palladium as a catalyst nucleus. On the other hand, as a catalyst activation treatment for electroless plating, a method in which palladium ions are reduced utilizing an oxidation reaction of tin ions, a method using a palladium sol, a method using a silane coupling agent, and the like are known.

However, the catalytic activity of copper is lower than that of gold (Au), nickel (Ni), palladium (Pd), cobalt (Co) or platinum (Pt). Therefore, in the electroless plating method using a hypophosphite as a reducing agent, when a metal having an ionization tendency larger than that of copper is electroless-plated on copper, a unfavorable phenomenon such that plating cannot be conducted at all, the plating cannot be conducted uniformly, the plating rate is low, or the like is likely to occur.

In addition, as shown in FIG. 3A, in the palladium catalyst method used in a general electroless plating method, it is known that palladium 131 is formed in an island form on the entire surface of both a copper wiring 121 and an interlayer dielectric film 111. In this case, as shown in FIG. 3B, a barrier layer 131 comprised of cobalt tungsten phosphorus is formed by plating using, as a catalyst nucleus, the palladium formed in an island form on the entire surface of both the copper wiring 121 and the interlayer dielectric film 111. However, palladium is ununiformly formed. Therefore, the barrier layer 131, which grows using such palladium as a nucleus, is likely to be also an ununiform film. In addition, for forming the barrier layer 131 in the form of a so-called continuous film on the entire surface of both the copper wiring 121 and the interlayer dielectric film 111, it is necessary to increase the thickness of the barrier layer, and the thickness depends on the density of the palladium formed in an island form. Such problems make it difficult to control the process.

Further, in the conventional palladium catalyst method, it is difficult to selectively form a palladium catalyst layer on the copper wiring, and thus, palladium elements disadvantageously adsorb onto the entire surface to be treated. In addition, in the palladium catalyst method using tin ions, it is confirmed that tin elements are drawn into the palladium layer, and problems are encountered in that tin causes the wiring resistance to rise and the long-term reliability of the wiring to be poor.

SUMMARY OF THE INVENTION

In this situation, the present inventors have made extensive and intensive studies with a view toward solving the above-mentioned problems accompanying the prior art, in connection with the process for fabricating a semiconductor device, which comprises forming, on a metal wiring formed from copper or a copper alloy, a barrier film which functions as a diffusion-preventing film for the metal wiring by an electroless plating method. As a result, it has unexpectedly been found that the above-mentioned problems inevitably accompanying the conventional techniques can be solved by, on the metal wiring, selectively forming a catalytic metal film which serves as a catalyst in the electroless plating method by a displacement plating method using a displacement plating solution at a temperature in a range of 30° C. or more and lower than a boiling point thereof; and selectively forming the barrier film on the catalytic metal film by the electroless plating method. The present invention has been completed, based on the above novel finding.

According to the above-described process for fabricating a semiconductor device, it is possible to uniformly form the catalytic metal film on the metal wiring since the catalytic metal film, which reacts as a catalyst for electroless plating, is selectively formed on the metal wiring by the displacement plating using the displacement plating solution at a temperature in the range of 30° C. or more and lower than a boiling point thereof. On the other hand, in a case where the temperature of the displacement plating solution is lower 30° C., the catalyst metal tend not to be deposited. Accordingly, it is difficult to form a uniform catalytic metal film on the metal wiring. In addition, in a case where the temperature of the displacement plating solution is higher than the boiling point thereof, gasification occurs in the displacement plating solution and the solution is difficult to be kept static. Or, gasification may continuously occur on a part of the metal wiring. Therefore, the temperature of the displacement plating solution is set to be in the range of 30° C. or more and lower than the boiling point thereof.

The pH of the displacement plating solution is need to be set in a range of 0.5 to 2.5, more preferably, 0.5 to 2.0. If the pH of the displacement plating solution is not adjusted appropriately, for example, the pH of the displacement plating solution is lower than 0.5, it becomes easy for the catalytic metal to physically absorb even on the surface other than the metal wiring, and thus, it becomes difficult to carry out the selective displacement plating. In a case where the pH of the displacement plating solution is higher than 2.5, the deposition speed of the catalytic metal becomes low and the catalytic metal is hardly deposited. Therefore, the pH of the displacement plating solution is preferably set in the range of 0.5 to 2.5, and more preferably, 0.5 to 2.0.

Furthermore, when the barrier film for coating the surface of the metal wiring using copper or copper alloy is selectively formed by electroless plating, as described above, the displacement plating is carried out using the metal ion solution the pH and the temperature of which are adjusted, which has an ionization tendency lower than copper and functions as a catalyst for electroless plating. Accordingly, it becomes possible to uniformly make the surface of the metal wiring to serve as a catalyst and to selectively form such as cobalt tungsten phosphorous and nickel tungsten phosphorous on the surface of copper by electroless plating. In this way, diffusion of copper is avoided by selectively coating the surface of the copper with cobalt tungsten phosphorous and nickel tungsten phosphorous.

BRIEF DESCRIPTION OF THE DRAWINGS

The foregoing and other objects, features and advantages of the present invention will be apparent to those skilled in the art from the following description of the presently preferred exemplary embodiments of the invention taken in connection with the accompanying drawings, in which.

DETAILED DESCRIPTION OF THE PREFERRED EMBODIMENT

Hereinbelow, one preferred embodiment of the process for fabricating a semiconductor device according to the present invention will be described in detail with reference to the diagrammatic cross-sectional views of FIGS. 1A to 1C, but the embodiment should not be construed as limiting the scope of the present invention.

Figure 1A:
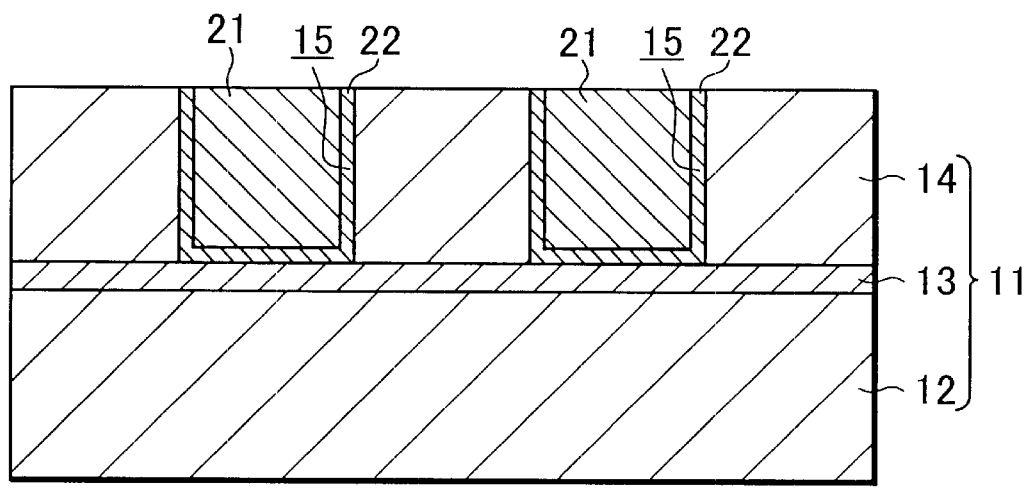
FIGS. 1A to 1C are diagrammatic cross-sectional views showing a process for fabricating a semiconductor device according to one preferred embodiment of the present invention.

As shown in FIG. 1A, a predetermined device (for example, a transistor, a capacitor or the like)(not shown) is formed on a semiconductor substrate (not shown) using a general process technique, and further, an interlayer dielectric film 11 is formed, for example, in a laminate structure comprising a silicon oxide film 12, a silicon nitride film 13 and a silicon oxide film 14. Then, for example, a trench 15 is formed in the silicon oxide film 14, and a metal wiring 21 is formed in the trench 15. The metal wiring 21 is formed as follows. Tantalum nitride is first deposited by a deposition process, for example, a sputtering process, a chemical vapor deposition (CVD) process or the like on the inner wall of the trench 15 formed in the interlayer dielectric film 11, to thereby form a barrier layer 22. Then, the trench 15 is plugged with copper by an electroplating method. Subsequently, the excess copper and barrier layer are removed by a CMP process to planarize the surface of the interlayer dielectric 11, to thereby form the metal wiring 21 made of copper within the trench 15.

Figure 1B:
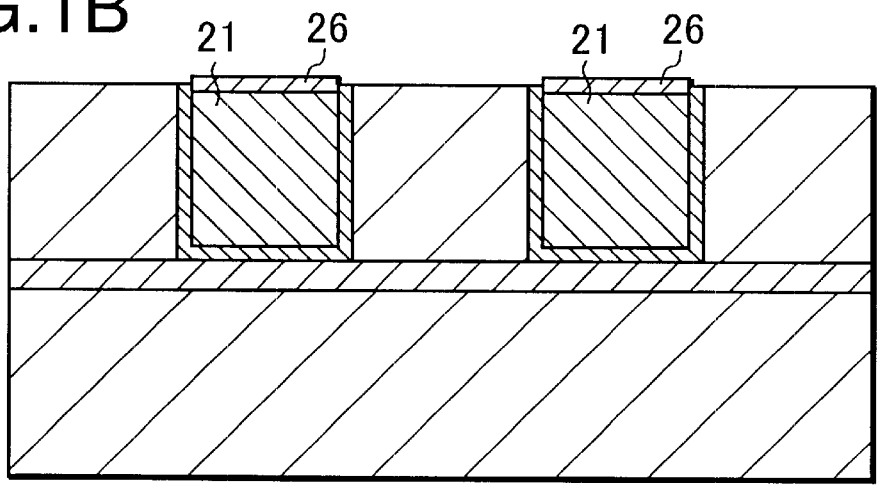

Then, as shown in FIG. 1B, the metal wiring 21 is subjected to treatment using a weak acid aqueous solution (for example, an aqueous hydrofluoric acid solution having a concentration of 1%) so as to remove a native oxide film (not shown) formed on the surface of the metal wiring 21 after subjected to the CMP process.

Subsequently, the resultant device is immersed in an aqueous solution of a palladium salt (for example, palladium chloride ($PdCl_2$)), of which the temperature and pH are controlled. Palladium has an ionization tendency smaller than that of copper. Therefore, a reaction represented by the formula: $Pd^{2+}+Cu \rightarrow Pd+Cu^{2+}$ proceeds, namely, electron donation and electron acceptation occur between metallic copper and palladium ions, so that copper and palladium displacement plating occurs. This reaction proceeds only at a portion of metallic copper in contact with the aqueous solution of palladium chloride. Therefore, the surface of the metal wiring 21 made of copper is displaced by palladium, to thereby form a catalytic metal film 26 comprising a thin palladium film. Then, the displacement reaction rate rapidly becomes low, and thus, the metal wiring 21 made of copper is not displaced by too large amount of palladium. In addition, the catalytic metal film 26 is selectively deposited only on the surface of the metal wiring 21, so that short-circuiting does not occur between the metal wiring 21 and another through the catalytic metal film 26.

The metal constituting the catalytic metal film 26 coating the surface of the metal wiring 21 is not limited to palladium, but any metal having an ionization tendency smaller than that of copper and having a catalytic action (for example, Au, Ni, Co, Pt or the like) may be used. For example, when an aqueous solution of a gold salt (for example, gold chloride ($AuCl_3$)) or a platinum salt (for example, platinum chloride ($PtCl_4$), or platinum sulfate ($Pt(SO_4)_2 \cdot 4H_2O$)) is used, displacement plating occurs between metallic copper and gold ions or platinum ions, so that the same effect can be obtained.

Figure 1C:
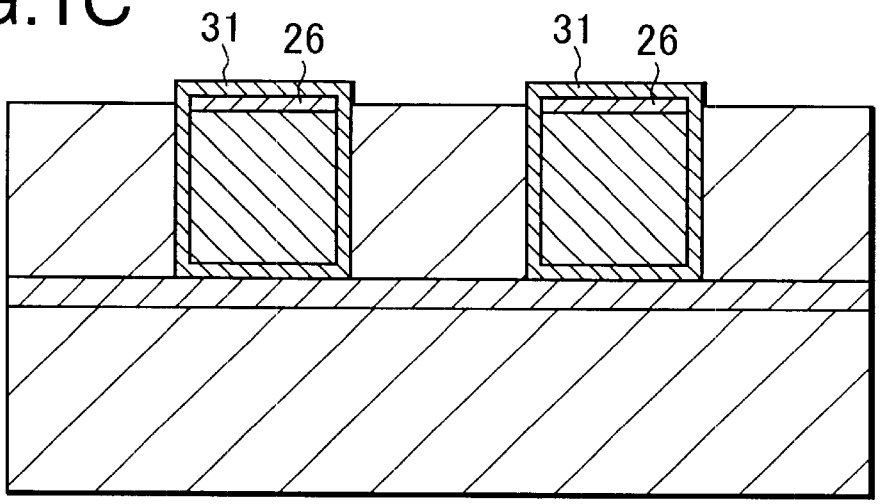

After the surface of the metal wiring 21 is coated with the catalytic metal film 26, as shown in FIG. 1C, a barrier film 31 comprising, for example, a cobalt tungsten phosphorus film is selectively deposited on the catalytic metal film 26 by an electroless plating method. In this instance, cobalt tungsten phosphorus is deposited only on the catalytic metal film 26 on the metal wiring 21. Therefore, the barrier film 31 can be selectively deposited on the metal wiring 21. In addition, by uniformly forming the catalytic metal film 26 on the metal wiring 21 by palladium displacement plating as mentioned above, it is possible to continuously form the thin and uniform barrier film 31 made of cobalt tungsten phosphorus only on the metal wiring 21.

The material for the barrier film 31 deposited by the electroless plating method is not limited to cobalt tungsten phosphorus, but any material having a barrier function of preventing copper from diffusing, for example, nickel tungsten phosphorus (NiWP) may be used.

As an example of the conditions for the removal treatment of the above-mentioned oxide (for example, native oxide film), there can be mentioned conditions such that an aqueous hydrofluoric acid solution having a concentration of 1% is used, and the treatment time is in the range of 2 to 30 seconds.

As an example of the conditions for the displacement plating method, there can be mentioned conditions such that a mixed solution of an aqueous solution of palladium chloride ($PdCl_2$) and hydrochloric acid (HCl) is used as the displacement plating solution, the concentration of palladium chloride in the mixed solution is 0.4 $g/dm^3$, the concentration of hydrochloric acid in the mixed solution is 10 $cm^3/dm^3$, the treatment time is in the range of from 1 to 3 minutes, the treatment temperature is in the range of 30° C. or more and lower than a boiling point of the solution thereof, and the pH is in the range of 0.5 to 2.5, preferably 0.5 to 2.0.

As an example of the conditions for the plating of cobalt tungsten phosphorus, there can be mentioned conditions such that the plating solution has a composition such that the concentration of ammonium tungstate is 10 $g/dm^3$, the concentration of cobalt chloride is 30 $g/dm^3$, the concentration of ammonium phosphinate is 20 $g/dm^3$, the concentration of ammonium oxalate is 80 $g/dm^3$ and a surfactant is in an appropriate amount, the temperature of the solution is 90° C., and the pH of the solution is in the range of 8.5 to 10.5.

Figure 2:
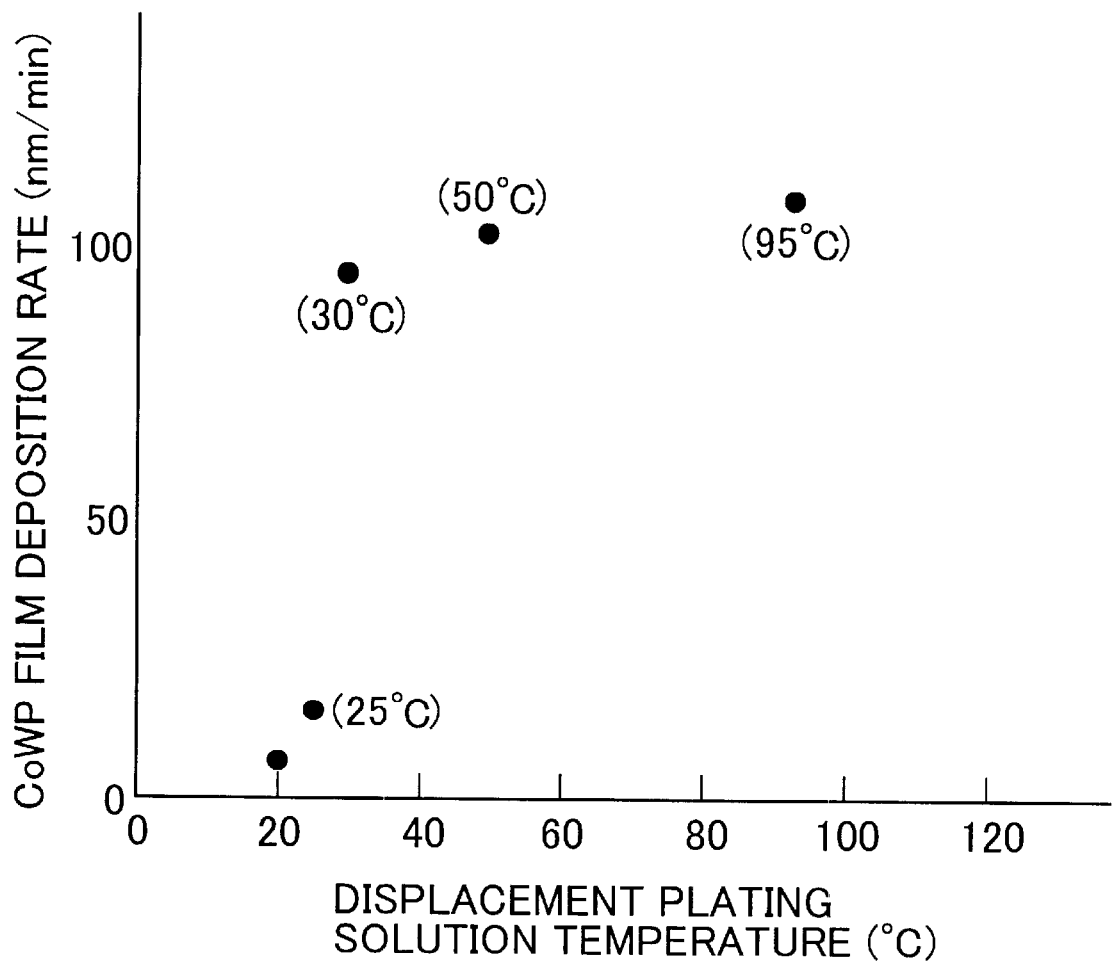
FIG. 2 is a graph showing the relationship between the deposition rate of a CoWP film and the temperature of a displacement plating solution.
Figure 3A:
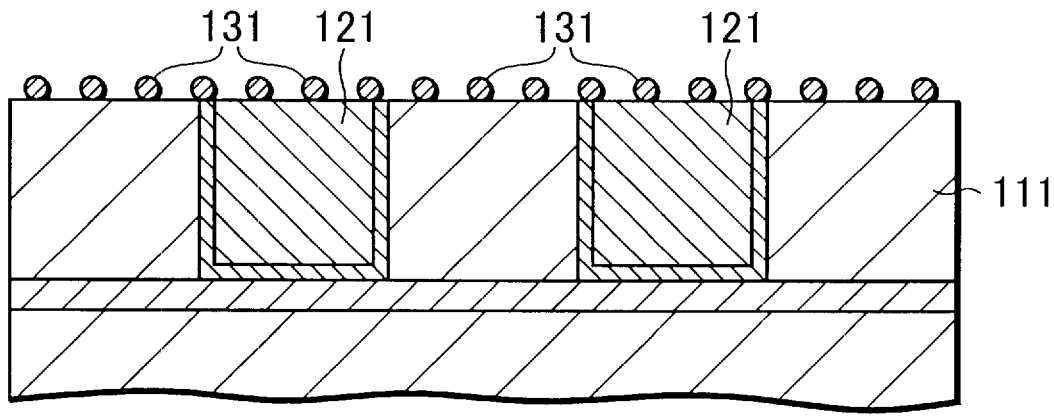
FIGS. 3A and 3B are explanatory diagrammatic cross-sectional views illustrating a task of the present invention.
Figure 3B:
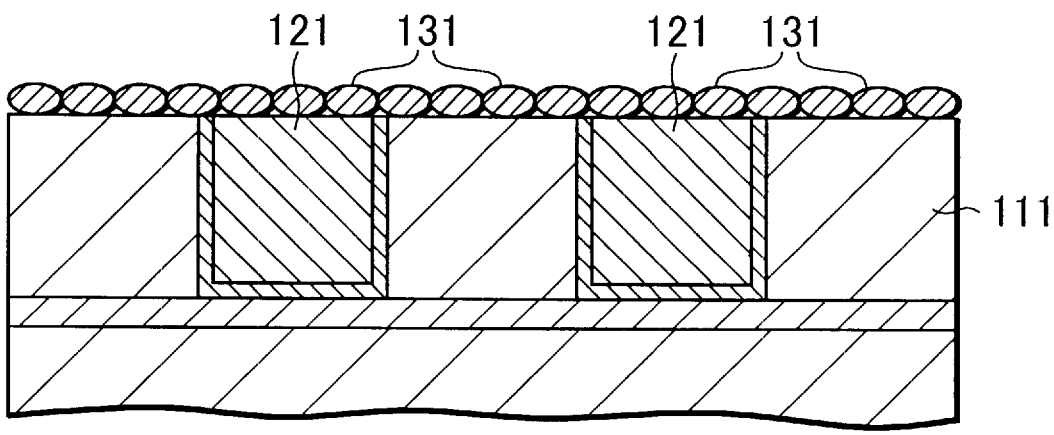

Next, with respect to the displacement plating solution, the conditions are described with reference to TABLE 1, and FIG. 2 showing the relationship between the deposition rate of a CoWP film and the temperature of the displacement plating solution.

As a palladium (Pd) selectivity, it was examined whether or not palladium was selectively formed on a metal wiring made of copper while changing the pH of the displacement plating solution, and the results are shown in TABLE 1.

TABLE 1

| pH | 0.4 | 0.5 | 0.8 | 2.0 | 3.0 |
|---|---|---|---|---|---|
| Pd selectivity | X | ○ | ○ | ○ | — |
| CoWP plating property | ○ | ○ | ○ | ○ | X |

From TABLE 1, it is found that, when the pH of the displacement plating solution is 0.4, palladium cannot be selectively formed, but, when the pH is 0.5 or more, palladium is selectively formed on the metal wiring.

In addition, with respect to cobalt tungsten phosphorus (CoWP) to be plated as a barrier film in the case where a palladium film is formed as a catalytic metal film, the plating property depending on the pH of the displacement plating solution was examined, and the results are also shown in TABLE 1 above. From TABLE 1 above, it is found that, when the pH of the displacement plating solution is in a range of 0.4 to 2.0, CoWP exhibits an excellent plating property, and, when the pH is 3.0, CoWP does not exhibit a satisfactory plating property. Therefore, the pH of the displacement plating solution is preferably in the range of 0.5 to 2.5, more preferably 0.5 to 2.0.

Furthermore, the relationship between the deposition rate of a CoWP film and the temperature of the displacement plating solution is shown in FIG. 2, and, in FIG. 2, the temperature of the displacement plating solution is taken as the abscissa, and the deposition rate of a CoWP film is taken as the ordinate.

As shown in FIG. 2, when the temperature of the displacement plating solution is 25° C. or 20° C., the deposition rate of the CoWP film does not reach 20 nm/min. That is, when the temperature of the displacement plating solution is lower than 30° C., it is often found that no catalytic metal is deposited, and thus, it is difficult to form a uniform catalytic metal film on the metal wiring. On the other hand, when the temperature of the displacement plating solution is 30° C. or higher, the deposition rate of the CoWP film is around 100 nm/min or more, and such a deposition rate is sufficient to form a required amount of the catalytic metal film for commercial production. Thus, when the temperature of the displacement plating solution is 30° C. or higher, a catalytic metal is ready to be selectively deposited on the metal wiring, and further, a catalytic metal film is uniformly formed on the metal wiring in the form of a continuous film. It should be noted that, when the temperature of the displacement plating solution is a boiling point thereof or higher, gasification occurs in the displacement plating solution and the solution is difficult to be kept static, or gasification may continuously occur on a part of the metal wiring. For this reason, it is difficult to form a uniform catalytic metal film on the metal wiring. Therefore, the temperature of the displacement plating solution is adjusted in the range of 30° C. or more and lower than a boiling point thereof.

In the process for fabricating a semiconductor device of the present invention, the catalytic metal film 26 which serves as a catalyst in the electroless plating method is formed on the metal wiring 21 employing the displacement plating method using a displacement plating solution at a temperature in the range of 30° C. or more and lower than a boiling point thereof having pH in the range of 0.5 to 2.5, preferably 0.5 to 2.0. Therefore, it is possible to uniformly form the catalytic metal film 26 on the metal wiring 21.

As mentioned above, in the process of the present invention, a displacement plating method is carried out using an aqueous solution of a metal which has an ionization tendency smaller than that of copper and functions as a catalyst in the electroless plating, of which the pH and the temperature are controlled. Therefore, the surface of the metal wiring 21 uniformly and selectively serves as a catalyst, so that the catalytic metal film 26 is uniformly and selectively formed on the metal wiring 21. Thus, when the barrier film 31, comprised of cobalt tungsten phosphorus, nickel tungsten phosphorus or the like, for coating the surface of the metal wiring 21 formed from copper or a copper alloy is formed, it is possible to selectively form the barrier film 31 on the surface of the metal wiring 21 through the catalytic metal film 26. By selectively coating the surface of the metal wiring 21 with the barrier film 31 comprised of cobalt tungsten phosphorus, nickel tungsten phosphorus or the like, copper is prevented from diffusing.

As mentioned above, by the process for fabricating a semiconductor device of the present invention, it is possible to selectively form a catalytic metal film on a metal wiring formed from copper or a copper alloy and selectively form a barrier film only on the catalytic metal film, i.e., only on the metal wiring. As a result, there is no need to use a barrier film having a high dielectric constant, such as a silicon nitride film, on the entire surface of the wiring and the interlayer dielectric. Therefore, both the effective dielectric constant between the wirings in the same layer and the effective dielectric constant between the wiring layers can be suppressed.

In addition, as mentioned above, it is possible to selectively and uniformly form the catalytic metal film on the metal wiring. Therefore, a uniform and thin barrier film can be formed on the catalytic metal film by an electroless plating method. As a result, the protuberance of the barrier film on the metal wiring, i.e., difference in level caused by the barrier film can be reduced, so that the planarization property in the formation of the upper layer wiring is improved, thus making it possible to improve the reliability of the upper layer wiring.

Further, in the catalyst activation treatment generally used, contamination with tin inevitably occurs, however, in the process of the present invention, no contamination with tin occurs. Therefore, a rise in wiring resistance can be suppressed, and further, the reliability of the wiring is improved.

What is claimed is:

1. A process for fabricating a semiconductor device, which comprises forming, on a metal wiring formed from copper or a copper alloy, a cobalt tungsten phosphorus barrier film which functions as a diffusion-preventing film for said metal wiring by an electroless plating method, said process comprising the steps of:

selectively forming, on said metal wiring, a catalytic metal film which serves as a catalyst in said electroless plating method by a displacement plating method using a displacement plating solution at a temperature in a range of 30° C. or more and lower than a boiling point thereof; and selectively forming said cobalt tungsten phosphorus barrier film on said catalytic metal film by the electroless plating method.

2. The process according to claim 1, wherein said displacement plating solution has pH in the range of 0.5 to 2.5.

3. The process according to claim 1, wherein said catalytic metal film is formed in the form of a continuous film on said metal wiring.

4. The process according to claim 1, wherein said cobalt tungsten phosphorus barrier film is formed in the form of a continuous film on said metal wiring through said catalytic metal film.

5. A process for fabricating a semiconductor device, comprising:

forming a metal wiring;

uniformly forming a catalytic metal film on the metal wiring by displacing a surface of the metal wiring by a displacement plating method wherein the displacement plating method comprises displacing the metal wiring in a metal ion solution, the metal ion solution having an ionization tendency lower than the metal wiring; and depositing a cobalt tungsten phosphorus barrier film on the catalytic metal film.

6. The process according to claim 5, further comprising adjusting the temperature of the metal ion solution.

7. The process according to claim 6, wherein the temperature of the metal ion solution is at least 30° C. and not greater than the boiling temperature of the metal ion solution.

8. The process according to claim 5, further comprising adjusting the pH of the metal ion solution.

9. The process according to claim 8, wherein the pH of the metal ion solution is at least 0.5 but not greater than 2.5.

10. The process according to claim 5, wherein the catalytic metal film is formed in a continuous film on the metal wiring.

11. The process according to claim 5, wherein the cobalt tungsten phosphorus barrier film is continuously formed on the metal wiring via the catalytic metal film.

12. The process according to claim 5, wherein the catalytic metal film is formed on the surface of the metal wiring.

13. The process according to claim 5, wherein the metal wiring is copper.

14. A process for fabricating a semiconductor device, comprising:

forming a copper wiring;

uniformly forming a catalytic metal film on the copper wiring by displacing a surface of the copper wiring by a displacement plating method wherein the displacement plating method comprises displacing the copper wiring in a metal ion solution, the metal ion solution having an ionization tendency lower than the copper wiring, adjusting the temperature of the metal ion solution, adjusting the pH of the metal ion solution; and depositing a cobalt tungsten phosphorus barrier film on the catalytic metal film.

15. The process according to claim 14, wherein the temperature of the metal ion solution is at least 30° C. and not greater than the boiling temperature of the metal ion solution.

16. The process according to claim 14, wherein the pH of the metal ion solution is at least 0.5 but not greater than 2.5.

17. The process according to claim 14, wherein the cobalt tungsten phosphorus barrier film is continuously formed on the copper wiring via the catalytic metal film.

18. The process according to claim 14, wherein the catalytic metal film is formed on the surface of the copper wiring.

* * * * *